US010340365B2

(12) United States Patent
Lu (10) Patent No.: US 10,340,365 B2
(45) Date of Patent: Jul. 2, 2019

(54) METHOD OF MANUFACTURING A THIN FILM TRANSISTOR (71) Applicant: SHENZHEN CHINA STAR OPTOELECTRONICS TECHNOLOGY CO., LTD., Guangdong (CN)

(72) Inventor: Macai Lu, Guangdong (CN)

(73) Assignee: SHENZHEN CHINA STAR OPTOELECTRONICS TECHNOLOG CO. LTD, Guangdong (CN)

( * ) Notice: Subject to any disclaimer, the term of this patent is extended or adjusted under 35 U.S.C. 154(b) by 414 days.

(21) Appl. No.: 15/121,928

(22) PCT Filed: Apr. 8, 2016

(86) PCT No.: PCT/CN2016/078761
§ 371 (c)(1),
(2) Date: Aug. 26, 2016

(87) PCT Pub. No.: WO2017/156808
PCT Pub. Date: Sep. 21, 2017

(65) Prior Publication Data
US 2018/0138295 A1 May 17, 2018

(30) Foreign Application Priority Data
Mar. 15, 2016 (CN) .......................... 2016 1 0147135

(51) Int. Cl.
H01L 27/32 (2006.01)
H01L 29/66 (2006.01)
(Continued)

(52) U.S. Cl.
CPC ...... *H01L 29/66757* (2013.01); *G02F 1/1368* (2013.01); *H01L 21/0273* (2013.01);
(Continued)

(58) Field of Classification Search
CPC ........... H01L 29/66757; H01L 27/1288; H01L 29/78621; H01L 29/4908; H01L 29/78675; H01L 21/26513; H01L 27/1255
See application file for complete search history.

(56) References Cited

U.S. PATENT DOCUMENTS 7,986,007 B2 * 7/2011 Huang .............. H01L 29/66659
257/350
2007/0190701 A1 * 8/2007 Ting .................. H01L 29/41733
438/149
(Continued)

FOREIGN PATENT DOCUMENTS

CN 1331202 C 8/2007
CN 203299773 U 11/2013
(Continued)

*Primary Examiner* — Bradley Smith
(74) *Attorney, Agent, or Firm* — Mark M. Friedman (57) ABSTRACT A method of manufacturing a thin film transistor is provided, and includes: providing a substrate; depositing a buffer layer and patterning the buffer layer; sequentially depositing an insulation layer and a first metal layer, coating a photoresist on the first metal layer; metal etching the first metal layer; ashing the photoresist; metal etching the first metal layer of the lightly doped region; implanting ions to an active area; and removing the photoresist.

19 Claims, 9 Drawing Sheets (51) Int. Cl.

| | | |
|---|---|---|
| *G02F 1/1368* | (2006.01) | |
| *H01L 21/266* | (2006.01) | |
| *H01L 21/02* | (2006.01) | |
| *H01L 21/027* | (2006.01) | |
| *H01L 21/265* | (2006.01) | |
| *H01L 21/3213* | (2006.01) | |
| *H01L 27/12* | (2006.01) | |
| *H01L 29/167* | (2006.01) | |
| *H01L 29/49* | (2006.01) | |
| *H01L 29/786* | (2006.01) | |

(52) U.S. Cl.
CPC .. *H01L 21/02532* (2013.01); *H01L 21/02592* (2013.01); *H01L 21/02667* (2013.01); *H01L 21/266* (2013.01); *H01L 21/26513* (2013.01); *H01L 21/32139* (2013.01); *H01L 27/1222* (2013.01); *H01L 27/1248* (2013.01); *H01L 27/1274* (2013.01); *H01L 27/1288* (2013.01); *H01L 29/167* (2013.01); *H01L 29/4908* (2013.01); *H01L 29/78621* (2013.01); *H01L 29/78675* (2013.01); *G02F 2001/13685* (2013.01); *G02F 2202/104* (2013.01)

(56) References Cited

U.S. PATENT DOCUMENTS

| | | | | |
|---|---|---|---|---|
| 2008/0233665 | A1* | 9/2008 | Jung | H01L 27/1255 |
| | | | | 438/23 |
| 2008/0258196 | A1* | 10/2008 | Chen | G02F 1/136213 |
| | | | | 257/296 |
| 2009/0267225 | A1* | 10/2009 | Eguchi | H01L 21/561 |
| | | | | 257/729 |
| 2010/0006847 | A1* | 1/2010 | Hu | H01L 21/2652 |
| | | | | 257/66 |
| 2014/0374718 | A1* | 12/2014 | Hsu | H01L 27/127 |
| | | | | 257/40 |
| 2016/0043188 | A1* | 2/2016 | Chu | H01L 27/124 |
| | | | | 257/72 |
| 2016/0372498 | A1* | 12/2016 | Ahn | H01L 27/1288 |
| 2017/0155002 | A1* | 6/2017 | Zhou | H01L 29/06 |
| 2017/0184892 | A1* | 6/2017 | Liu | G02F 1/134309 |
| 2018/0033808 | A1* | 2/2018 | Li | H01L 21/02532 |
| 2018/0226462 | A1* | 8/2018 | Zhou | H01L 27/3262 |

FOREIGN PATENT DOCUMENTS

| | | |
|---|---|---|
| CN | 103568196 A | 2/2014 |
| TW | 201017499 A | 5/2010 |

\* cited by examiner

METHOD OF MANUFACTURING A THIN FILM TRANSISTOR

FIELD OF THE INVENTION

The present invention relates to the field of manufacturing transistors, and more particularly to a method of manufacturing thin film transistors.

BACKGROUND OF THE INVENTION

Low temperature poly-silicon thin film transistor (LTPS TFT) substrates can be applied on advanced display devices, e.g. liquid crystal display (LCD) devices, active-matrix organic light-emitting diodes (AMOLED), etc. In comparison to other TFTs, the low temperature poly-silicon thin film transistors have higher carrier mobility, which causes a hot carrier effect to appear, and it may even cause the thin film transistor to be invalidated.

In order to prevent the production of the hot carrier effect, when manufacturing the low temperature poly-silicon thin film transistor, a lightly doped transition region is formed by implanting ions to a source and a drain of the low temperature poly-silicon thin film transistor. However, when implanting ions to the source and the drain of the low temperature poly-silicon thin film transistor, it is difficult to form a symmetrical lightly doped transition region on both sides of the source and the drain, thereby causing that a doping concentration is deviated or a gate region is shifted.

Accordingly, it is necessary to provide a method of manufacturing thin film transistors to solve the technical problem in the prior art.

SUMMARY OF THE INVENTION

The present invention provides a method of manufacturing a thin film transistor with a simple process by which a symmetrical lightly doped transition region on both sides of a source and a drain can be formed, so as to solve the technical problem that a doping concentration is deviated or a gate region is shifted due to it being difficult to form a symmetrical lightly doped transition region on both sides of the source and the drain in the conventional method of manufacturing a thin film transistor.

The present invention provides a method of manufacturing a thin film transistor, comprises:
providing a substrate;
depositing a buffer layer on the substrate and patterning the buffer layer, so as to form an active area of a thin film transistor;
sequentially depositing an insulation layer and a first metal layer on the substrate;
coating a photoresist on a gate region and a lightly doped region of the first metal layer, wherein the gate region and the lightly doped region are covered by a projection of the active area on the first metal layer;
metal etching the first metal layer excluding the gate region and the lightly doped region for exposing the insulation layer;
ashing the photoresist for exposing the lightly doped region of the first metal layer;
metal etching the first metal layer at the lightly doped region for forming a metal half tone mask;
implanting ions to the active area for forming a source region, a source lightly doped region, a channel region, a drain lightly doped region, and a drain region of the thin film transistor;
removing the photoresist;
depositing a media layer over the substrate, and forming a source through-hole and a drain through-hole on the media layer;
depositing a second metal layer over the substrate, and patterning the second metal layer, so as to form a source and a drain of the thin film transistor through the source through-hole and the drain through-hole;
depositing an organic planarization layer over the substrate, and forming a pixel electrode through-hole on the organic planarization layer; and
depositing a pixel electrode layer over the substrate, and patterning the pixel electrode layer, so as to form a corresponding pixel electrode through the pixel electrode through-hole;
wherein the step of depositing the buffer layer on the substrate and patterning the buffer layer, comprises:
depositing an amorphous silicon buffer layer on the substrate;
annealing the amorphous silicon buffer layer to form a polycrystalline silicon buffer layer; and
patterning the polycrystalline silicon buffer layer.

In the method of manufacturing a thin film transistor of the present invention, after the step of removing the photoresist, the method further comprises: etching the metal half tone mask.

In the method of manufacturing a thin film transistor of the present invention, the first metal layer is a single metal layer or multiple metal layers and is selected from the group consisting of molybdenum and aluminum.

In the method of manufacturing a thin film transistor of the present invention, the thin film transistor is an N type metal-oxide-semiconductor thin film transistor, and the implanted ions are phosphorus ions or arsenic ions.

In the method of manufacturing a thin film transistor of the present invention, the thin film transistor is a P type metal-oxide-semiconductor thin film transistor, and the implanted ions are boron ions.

The present invention also provides a method of manufacturing a thin film transistor, comprising:
providing a substrate;
depositing a buffer layer on the substrate and patterning the buffer layer, so as to form an active area of a thin film transistor;
sequentially depositing an insulation layer and a first metal layer on the substrate;
coating a photoresist on a gate region and a lightly doped region of the first metal layer, wherein the gate region and the lightly doped region are covered by a projection of the active area on the first metal layer;
metal etching the first metal layer excluding the gate region and the lightly doped region for exposing the insulation layer;
ashing the photoresist for exposing the lightly doped region of the first metal layer;
metal etching the first metal layer at the lightly doped region for forming a metal half tone mask;
implanting ions to the active area for forming a source region, a source lightly doped region, a channel region, a drain lightly doped region, and a drain region of the thin film transistor; and
removing the photoresist.

In the method of manufacturing a thin film transistor of the present invention, after the step of removing the photoresist, the method further comprises: etching the metal half tone mask.

In the method of manufacturing a thin film transistor of the present invention, after the step of removing the photoresist, the method further comprises:

depositing a media layer over the substrate, and forming a source through-hole and a drain through-hole on the media layer;

depositing a second metal layer over the substrate, and patterning the second metal layer, so as to form a source and a drain of the thin film transistor through the source through-hole and the drain through-hole;

depositing an organic planarization layer over the substrate, and forming a pixel electrode through-hole on the organic planarization layer; and depositing a pixel electrode layer over the substrate, and patterning the pixel electrode layer, so as to form a corresponding pixel electrode through the pixel electrode through-hole.

In the method of manufacturing a thin film transistor of the present invention, the step of depositing the buffer layer on the substrate and patterning the buffer layer, comprises:

depositing an amorphous silicon buffer layer on the substrate;

annealing the amorphous silicon buffer layer to form a polycrystalline silicon buffer layer; and patterning the polycrystalline silicon buffer layer.

In the method of manufacturing a thin film transistor of the present invention, the first metal layer is a single metal layer or multiple metal layers and is selected from the group consisting of molybdenum and aluminum.

In the method of manufacturing a thin film transistor of the present invention, the thin film transistor is an N type metal-oxide-semiconductor thin film transistor, and the implanted ions are phosphorus ions or arsenic ions.

In the method of manufacturing a thin film transistor of the present invention, the thin film transistor is a P type metal-oxide-semiconductor thin film transistor, and the implanted ions are boron ions.

The present invention also provides a method of manufacturing a thin film transistor, comprising:

providing a substrate;

depositing a buffer layer on the substrate and patterning the buffer layer, so as to form a first active area of a first thin film transistor and a second active area of a second thin film transistor;

sequentially depositing an insulation layer and a first metal layer on the substrate;

coating a first photoresist on a first gate region, a lightly doped region, and a second gate region of the first metal layer, wherein the first gate region and the lightly doped region are covered by a projection of the first active area on the first metal layer, and the second gate region is covered by a projection of the second active area on the first metal layer;

metal etching the first metal layer excluding the first gate region, the lightly doped region, and the second gate region for exposing the insulation layer;

coating a second photoresist on the second thin film transistor;

ashing the first photoresist for exposing the lightly doped region of the first metal layer;

metal etching the first metal layer at the lightly doped region for forming a metal half tone mask;

implanting ions to the first active area for forming a source region, a source lightly doped region, a channel region, a drain lightly doped region, and a drain region of the first thin film transistor; and removing the first photoresist and the second photoresist;

coating a third photoresist on the first thin film transistor;

implanting the ions to the second active area for forming a source region, a channel region, and a drain region of the second thin film transistor; and removing the third photoresist.

In the method of manufacturing a thin film transistor of the present invention, after the step of removing the first photoresist and the second photoresist, the method further comprises: etching the metal half tone mask.

In the method of manufacturing a thin film transistor of the present invention, after the step of removing the third photoresist, the method further comprises:

depositing a media layer over the substrate, and forming a source through-hole and a drain through-hole on the media layer;

depositing a second metal layer over the substrate, and patterning the second metal layer, so as to form a source and a drain of the first thin film transistor and a source and a drain of the second thin film transistor through the source through-hole and the drain through-hole;

depositing an organic planarization layer over the substrate, and forming a pixel electrode through-hole on the organic planarization layer; and depositing a pixel electrode layer over the substrate, and patterning the pixel electrode layer, so as to form a corresponding pixel electrode through the pixel electrode through-hole.

In the method of manufacturing a thin film transistor of the present invention, the step of depositing the buffer layer on the substrate and patterning the buffer layer comprises:

depositing an amorphous silicon buffer layer on the substrate;

annealing the amorphous silicon buffer layer to form a polycrystalline silicon buffer layer; and patterning the polycrystalline silicon buffer layer.

In the method of manufacturing a thin film transistor of the present invention, the first metal layer is a single metal layer or multiple metal layers and is selected from the group consisting of molybdenum and aluminum.

In the method of manufacturing a thin film transistor of the present invention, the thin film transistor is an N type metal-oxide-semiconductor thin film transistor, and the implanted ions are phosphorus ions or arsenic ions.

In the method of manufacturing a thin film transistor of the present invention, the thin film transistor is a P type metal-oxide-semiconductor thin film transistor, and the implanted ions are boron ions.

In the method of manufacturing a thin film transistor of the present invention, a lightly doped region is doped by using a metal half tone mask, so as to ensure that the lightly doped region formed on both sides of a source and a drain is symmetrical, and to keep the manufacturing process simple, so that the technical problem that a doping concentration is deviated or a gate region is shifted due to it being difficult to form a symmetrical lightly doped transition region on both sides of the source and the drain in the conventional method of manufacturing a thin film transistor.

BRIEF DESCRIPTION OF THE DRAWINGS

In order to illustrate the technical solutions in the embodiments of the present invention or in the prior art more clearly, the following briefly introduces the accompanying drawings required for describing the embodiments or the prior art. The accompanying drawings in the following description are merely some embodiments of the present invention, and persons of ordinary skill in the art may still derive other drawings from these accompanying drawings without creative effort.

DETAILED DESCRIPTION OF THE INVENTION

Please refer to the accompanying drawings, similar parts are denoted with the same reference numerals. The following description is based on the particular embodiments of the present invention, and they should not be construed as limiting the invention to the other embodiments which are not discussed in detail herein.

Figure 1:
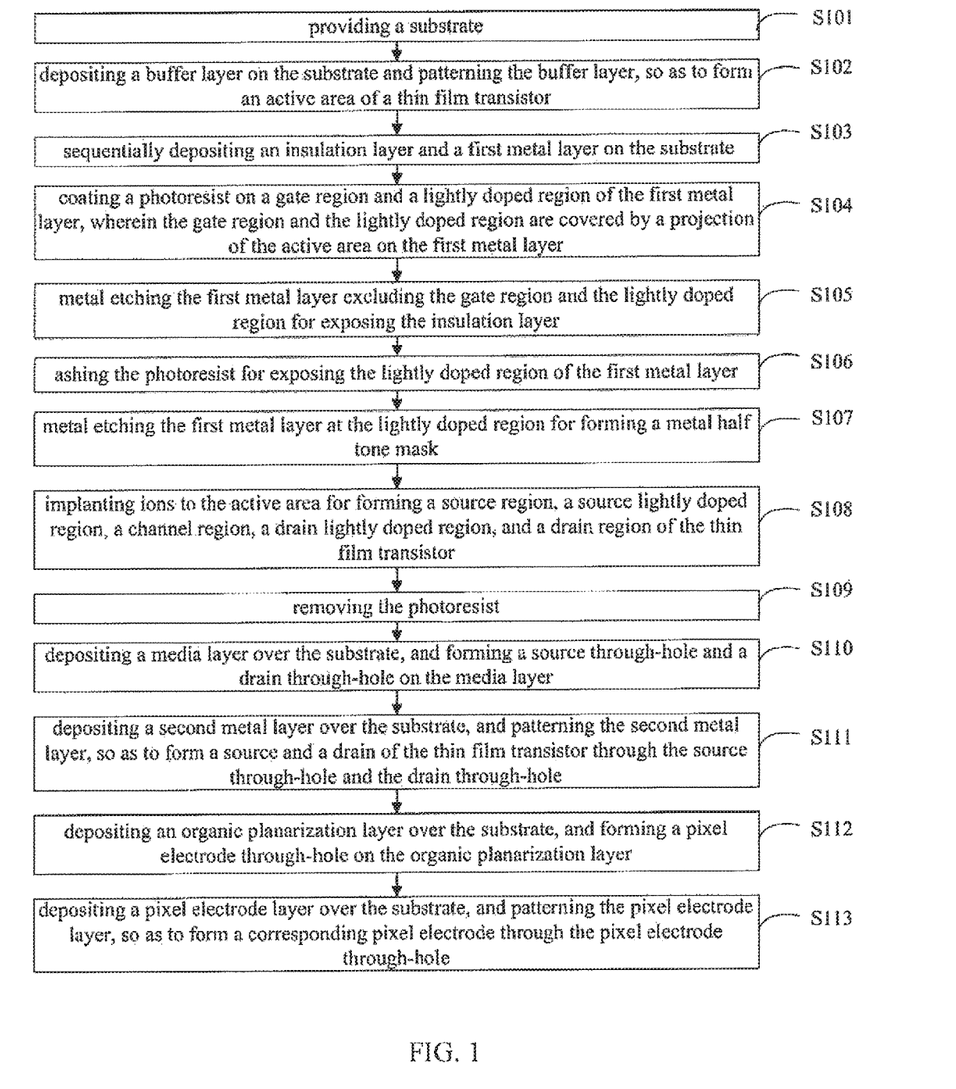
FIG. 1 is a flow chart illustrating the method of manufacturing a thin film transistor of a first preferred embodiment of the present invention.

Please refer to FIG. 1, which shows a flow chart illustrating the method of manufacturing a thin film transistor of a first preferred embodiment of the present invention. The method of manufacturing a thin film transistor of the present invention comprises the following steps:

Step S101, providing a substrate;

Step S102, depositing a buffer layer on the substrate and patterning the buffer layer, so as to form an active area of a thin film transistor;

Step S103, sequentially depositing an insulation layer and a first metal layer on the substrate;

Step S104, coating a photoresist on a gate region and a lightly doped region of the first metal layer;

Step S105, metal etching the first metal layer excluding the gate region and the lightly doped region for exposing the insulation layer;

Step S106, ashing the photoresist for exposing the lightly doped region of the first metal layer;

Step S107, metal etching the first metal layer at the lightly doped region for forming a metal half tone mask;

Step S108, implanting ions to the active area for forming a source region, a source lightly doped region, a channel region, a drain lightly doped region, and a drain region of the thin film transistor;

Step S109, removing the photoresist;

Step S110, depositing a media layer over the substrate, and forming a source through-hole and a drain through-hole on the media layer;

Step S111, depositing a second metal layer over the substrate, and patterning the second metal layer, so as to form a source and a drain of the thin film transistor through the source through-hole and the drain through-hole;

Step S112, depositing an organic planarization layer over the substrate, and forming a pixel electrode through-hole on the organic planarization layer; and Step S113, depositing a pixel electrode layer over the substrate, and patterning the pixel electrode layer, so as to form a corresponding pixel electrode through the pixel electrode through-hole.

The detailed processes of each of the steps of the method of manufacturing a thin film transistor of the present invention are described below.

Figure 2A:
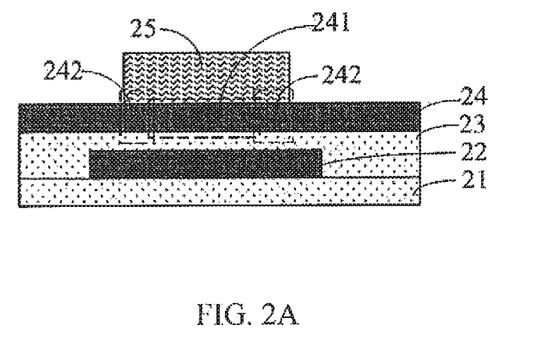
FIGS. 2A to 2H are schematic diagrams illustrating the method of manufacturing a thin film transistor of the first preferred embodiment of the present invention.

In the step S101, also referring to FIG. 2A, a substrate 21 is provided, and then the method turns to the step S102.

In the step S102, an amorphous silicon buffer layer is deposited on the substrate 21. The material of the amorphous silicon buffer layer may be selected from at least one of silicon nitride or silicon oxide. Then, the amorphous silicon buffer layer is excimer laser annealed, so that the amorphous silicon is transferred into polycrystalline silicon, so as to form a polycrystalline silicon buffer layer. Then, an active layer 22 of the thin film transistor is formed by performing a patterning process including photoresist coating, exposure, and etching. The photoresist is removed, and then the method turns to the step S103.

In the step S103, an insulation layer 23 and a first metal layer 24 are sequentially deposited on the substrate 21. The material of the insulation layer 23 may be selected from at least one of silicon nitride or silicon oxide. The first metal layer 24 is a single metal layer or multiple metal layers and is selected from the group consisting of molybdenum and aluminum. Then, the method turns to the step S104.

In the step S104, a photoresist 25 is coated on a gate region 241 and a lightly doped region 242 of the first metal layer 24. The gate region 241 and the lightly doped region 242 are covered by (i.e., within) a projection of the active area 22 on the first metal layer 24. Then, the method turns to the step S105.

Figure 2B:
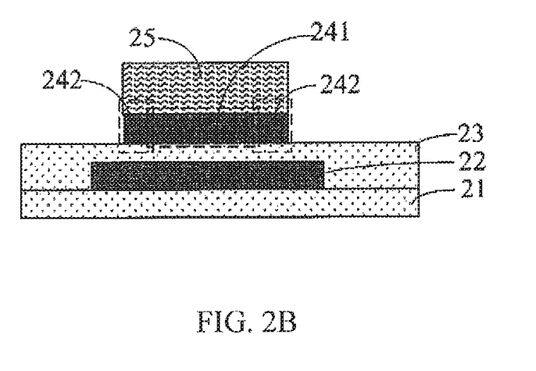

In the step S105, the first metal layer 24 excluding the gate region 241 and the lightly doped region 242 is metal etched for exposing the insulation layer 23. Please refer to FIG. 2B, which shows the structure of the thin film transistor after performing the metal etching process. Then, the method turns to the step S106.

Figure 2C:
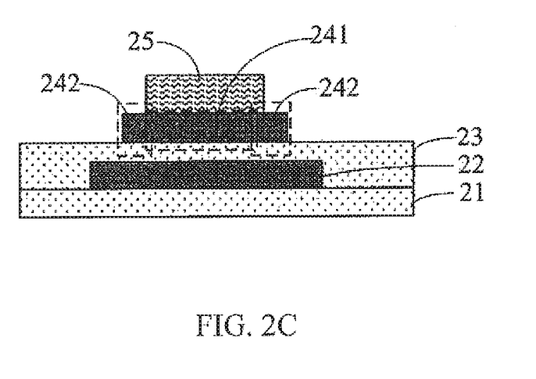

In the step S106, the photoresist 25 is ashed for exposing the lightly doped region 242 of the first metal layer 24. Since the effect of performing the ashing process on both sides of the photoresist 25 is the same, the exposed area of the lightly doped region 242 on both sides of the first metal layer 24 is the same. Please refer to FIG. 2C, which shows the structure of the thin film transistor after performing the ashing process. Then, the method turns to the step S107.

Figure 2D:
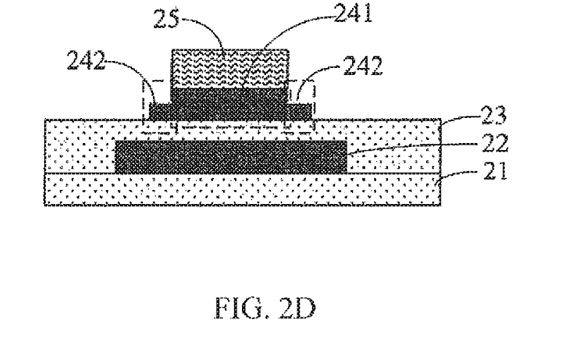

In the step S107, the first metal layer 24 at the lightly doped region 242 is metal etched. That is, a portion of the first metal layer 24 at the lightly doped region 242 is etched, and a metal half tone mask is formed by the remaining first metal layer 24 at the lightly doped region 242. Please refer to FIG. 2D, which shows the structure of the thin film transistor after performing the metal etching process. Then, the method turns to the step S108.

In the step S108, ions are implanted into the active area 22. The active area 22 without being shielded by the metal layer is implanted with ions, so as to form a source region 221 and a drain region 222 of the thin film transistor. The active area 22 being shielded by the metal half tone mask is implanted with ions, so as to form a source lightly doped region 223 and a drain lightly doped region 224 of the thin film transistor. The active layer 22 being shielded by the photoresist 25 and the metal layer 24 is not implanted with ions, and the active layer 22 at this region forms a channel region 225 of the thin film transistor, as shown in FIG. 2E.

Figure 2E:
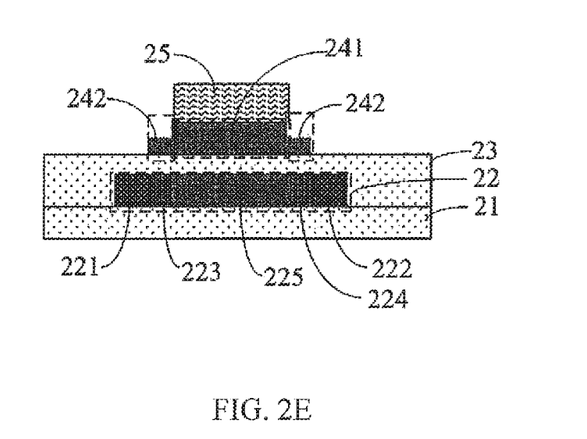

Please refer to FIG. 2E, if the thin film transistor is an N type metal-oxide-semiconductor thin film transistor, the implanted ions are phosphorus ion or arsenic ion. If the thin film transistor is a P type metal-oxide-semiconductor thin film transistor, the implanted ions are boron ions. Then, the method turns to the step S109.

Figure 2F:
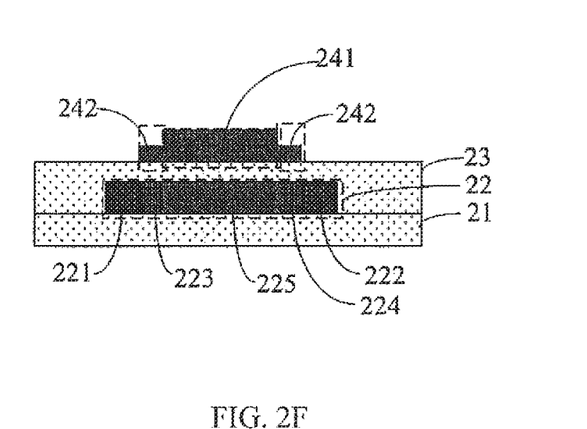
Figure 2G:
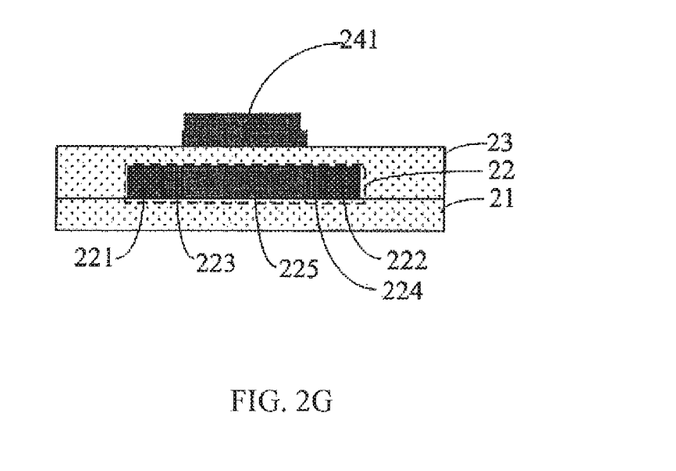

In the step S109, the photoresist 25 is removed. Please refer to FIG. 2F, which shows the structure of the thin film transistor after performing the removing process. Here, the metal half tone mask may be etched. Please refer to FIG. 2G, which shows the structure of the thin film transistor after performing the etching process. Then, the method turns to the step S110.

Figure 2H:
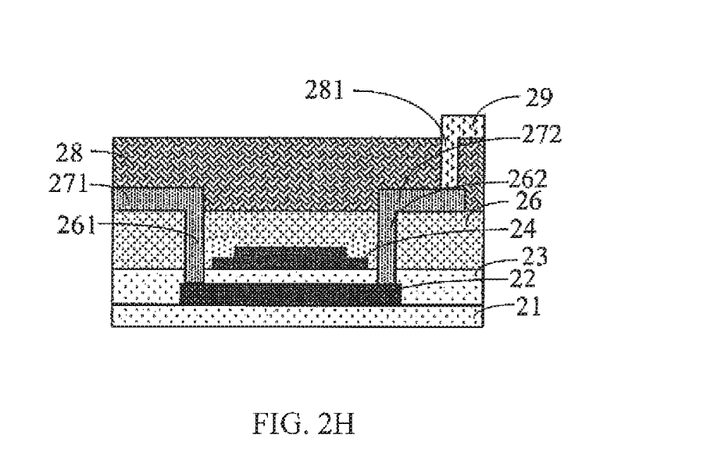

In the step S110, referring to FIG. 2H, a media layer 26 is deposited over the substrate 21. A source through-hole 261 and a drain through-hole 262 are formed on the media layer 26 by performing photoresist coating, exposure, and etching processes. Then, the method turns to the step S111.

In the step S111, a second metal layer is deposited over the substrate 21, and the second metal layer is patterned, so as to form a source 271 and a drain 272 of the thin film transistor through the source through-hole 261 and the drain through-hole 262. Then, the method turns to the step S112.

In the step S112, an organic planarization layer 28 is deposited over the substrate 21, and a pixel electrode through-hole 281 in formed on the organic planarization layer 28. Then, the method turns to the step S113.

In the step S113, a pixel electrode layer is deposited over the substrate 21, and the pixel electrode layer is patterned, so as to form a corresponding pixel electrode 29 through the pixel electrode through-hole 281. Please refer to FIG. 2H, which shows the structure of the thin film transistor after manufacturing is completed.

Thus, the thin film transistor of the present preferred embodiment is completed.

In the method of manufacturing a thin film transistor of the present preferred embodiment, the lightly doped region is doped by using the metal half tone mask, so as to ensure that the lightly doped region formed on both sides of the source and the drain is symmetrical, and to keep the manufacturing process simple.

Figure 3:
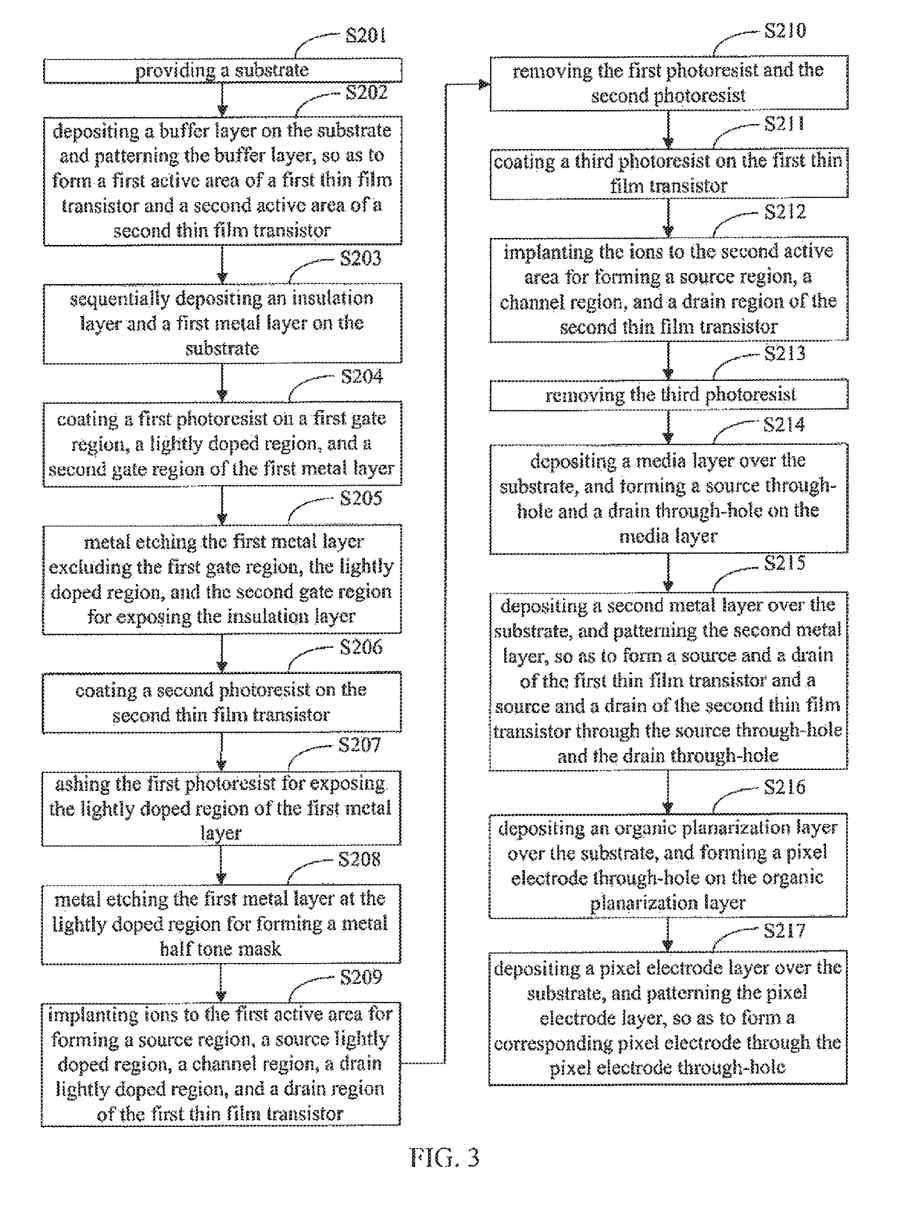
FIG. 3 is a flow chart illustrating the method of manufacturing a thin film transistor of a second preferred embodiment of the present invention.

Please refer to FIG. 3, which shows a flow chart illustrating the method of manufacturing a thin film transistor of a second preferred embodiment of the present invention. The method of manufacturing a thin film transistor of the present preferred embodiment comprises the following steps.

Step S201, providing a substrate;

Step S202, depositing a buffer layer on the substrate and patterning the buffer layer, so as to form a first active area of a first thin film transistor and a second active area of a second thin film transistor;

Step S203, sequentially depositing an insulation layer and a first metal layer on the substrate;

Step S204, coating a first photoresist on a first gate region, a lightly doped region, and a second gate region of the first metal layer;

Step S205, metal etching the first metal layer excluding the first gate region, the lightly doped region, and the second gate region for exposing the insulation layer;

Step S206, coating a second photoresist on the second thin film transistor;

Step S207, ashing the first photoresist for exposing the lightly doped region of the first metal layer;

Step S208, metal etching the first metal layer at the lightly doped region for forming a metal half tone mask;

Step S209, implanting ions to the first active area for forming a source region, a source lightly doped region, a channel region, a drain lightly doped region, and a drain region of the first thin film transistor;

Step S210, removing the first photoresist and the second photoresist;

Step S211, coating a third photoresist on the first thin film transistor;

Step S212, implanting the ions to the second active area for forming a source region, a channel region, and a drain region of the second thin film transistor;

Step S213, removing the third photoresist;

Step S214, depositing a media layer over the substrate, and forming a source through-hole and a drain through-hole on the media layer;

Step S215, depositing a second metal layer over the substrate, and patterning the second metal layer, so as to form a source and a drain of the first thin film transistor and a source and a drain of the second thin film transistor through the source through-hole and the drain through-hole;

Step S216, depositing an organic planarization layer over the substrate, and forming a pixel electrode through-hole on the organic planarization layer; and Step S217, depositing a pixel electrode layer over the substrate, and patterning the pixel electrode layer, so as to form a corresponding pixel electrode through the pixel electrode through-hole.

The detailed processes of each step of the method of manufacturing a thin film transistor of the present invention are described below.

Figure 4A:
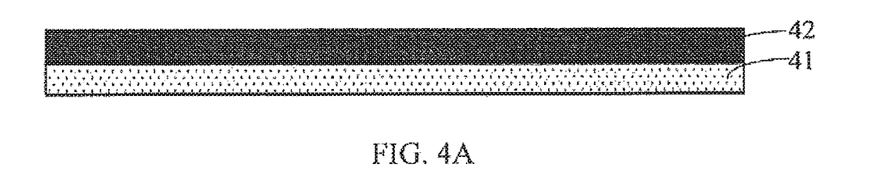
FIGS. 4A to 4M are schematic diagrams illustrating the method of manufacturing a thin film transistor of the second preferred embodiment of the present invention.

In the step S201, also referring to FIG. 4A, a substrate 41 is provided, and then the method turns to the step S202.

Figure 4B:
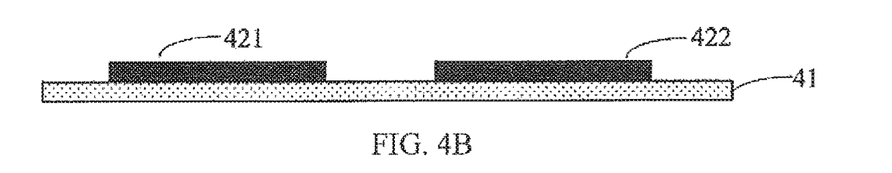

In the step S402, an amorphous silicon buffer layer 42 is deposited on the substrate 41. The material of the amorphous silicon buffer layer may be selected from at least one of silicon nitride or silicon oxide. Then, as shown on FIG. 4A, the amorphous silicon buffer layer is excimer laser annealed, so that the amorphous silicon is transferred into polycrystalline silicon, so as to form a polycrystalline silicon buffer layer. Then, as shown on FIG. 4B, a first active area 421 of a first thin film transistor and a second active area 422 of a second thin film transistor are formed by performing a patterning process including photoresist coating, exposure, and etching on the polycrystalline silicon buffer layer. Then, the method turns to the step S203.

Figure 4C:
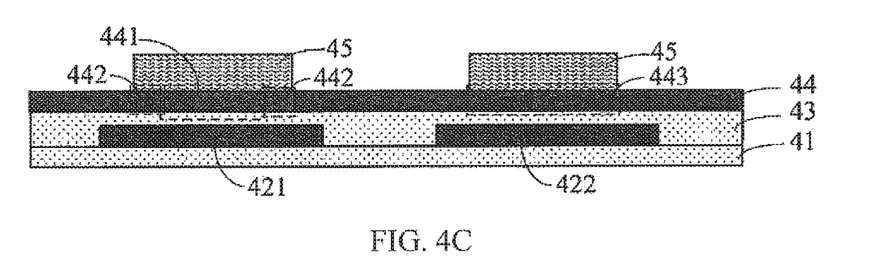

In the step S203, also referring to FIG. 4C, an insulation layer 43 and a first metal layer 44 are sequentially deposited on the substrate 41. The material of the insulation layer 43 may be selected from at least one of silicon nitride or silicon oxide. The first metal layer 44 is a single metal layer or multiple metal layers and is selected from the group consisting of molybdenum and aluminum. Then, the method turns to the step S204.

In the step S204, a photoresist 45 is coated on a first gate region 441, a lightly doped region 442, and a second gate region 443 of the first metal layer 44. The first gate region 441 and the lightly doped region 442 are covered by (i.e., within) a projection of the first active area 421 on the first metal layer 44. Please refer to FIG. 4C, which shows the structure of the thin film transistor after performing the coating process. Then, the method turns to the step S205.

Figure 4D:
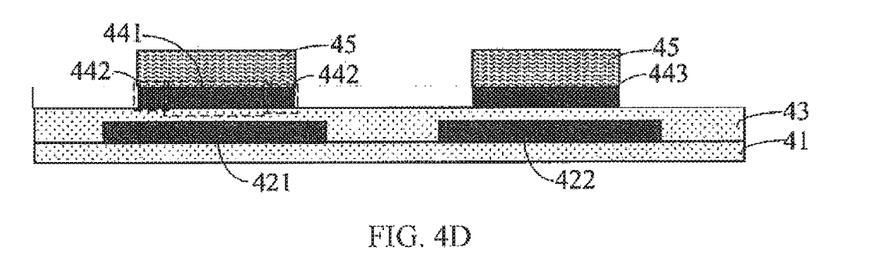

In the step S205, the first metal layer 44 excluding the first gate region 441, the lightly doped region 442, and the second gate region 443 is metal etched for exposing the insulation layer 43. Please refer to FIG. 4D, which shows the structure of the thin film transistor after performing the metal etching process. Then, the method turns to the step S206.

Figure 4E:
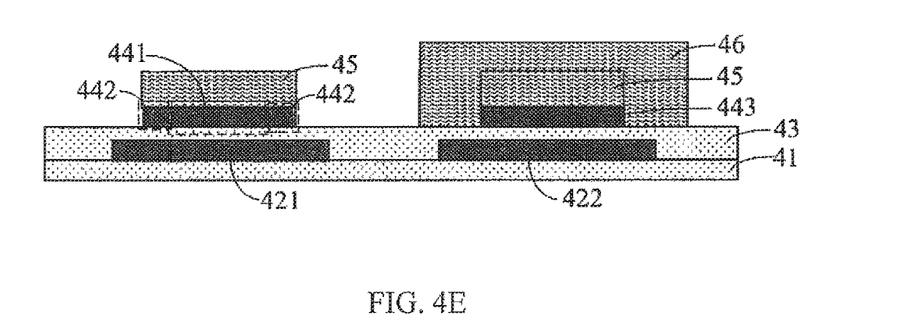

In the step S206, a second photoresist 46 is coated on the second thin film transistor. Please refer to FIG. 4E, which shows the structure of the thin film transistor after performing the coating process. Then, the method turns to the step S207.

In the step S207, the first photoresist 45 is ashed for exposing the lightly doped region 442 of the first metal layer 44. Since the effect of performing the ashing process on both sides of the photoresist is the same, the exposed area of the lightly doped region 442 on both sides of the first metal layer 44 is the same. Please refer to FIG. 4F, which shows the structure of the thin film transistor after performing the coating process. Then, the method turns to the step S208.

Figure 4F:
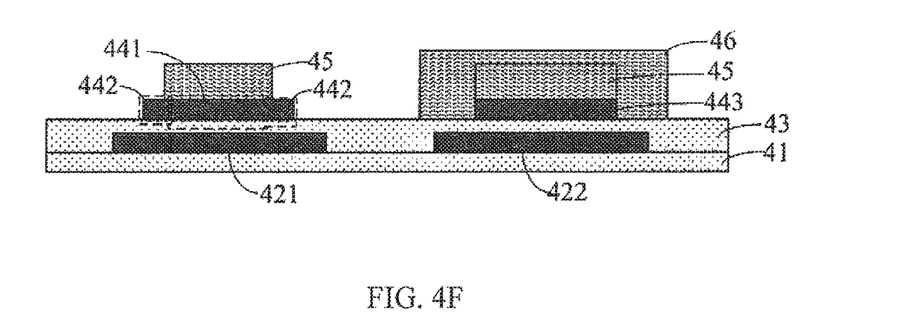

In the step S208, the first metal layer 44 at the lightly doped region 442 is metal etched. That is, a portion of the first metal layer 44 at the lightly doped region 442 is etched, and a metal half tone mask is formed by the remaining first metal layer 44 at the lightly doped region 442. Then, the method turns to the step S209.

Figure 4G:
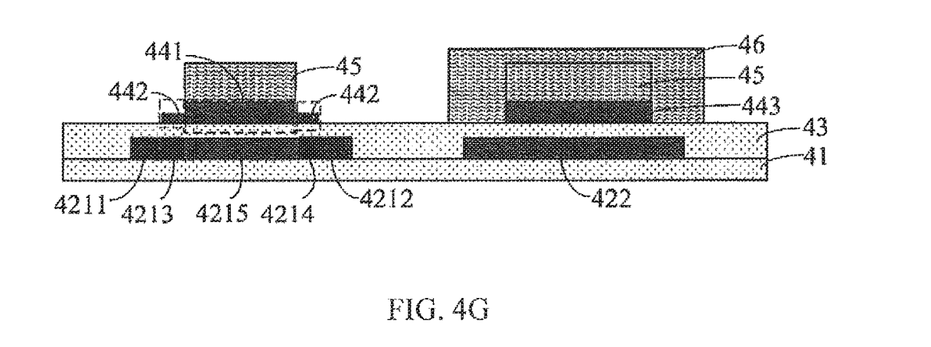

In the step S209, ions are implanted into the first active area 421. The active area without being shielded by the metal layer is implanted with ions, so as to form a source region 4221 and a drain region 4212 of the first thin film transistor. The first active layer being shielded by the metal half tone mask is implanted with ions, so as to form a source lightly doped region 4213 and a drain lightly doped region 4214 of the first thin film transistor. The first active layer being shielded by the photoresist 45 and the metal layer 44 is not implanted with ions, and the active layer 22 at this region forms a channel region 4215 of the first thin film transistor.

Please refer to FIG. 4G, if the first thin film transistor is an N type metal-oxide-semiconductor thin film transistor, the implanted ions are phosphorus ion or arsenic ion. If the first thin film transistor is a P type metal-oxide-semiconductor thin film transistor, the implanted ions are boron ions. Then, the method turns to the step S210.

Figure 4H:
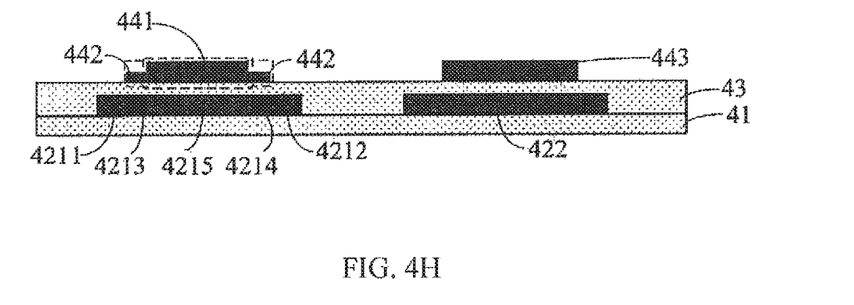

In the step S210, the first photoresist 45 and the second photoresist 46 are removed. Please refer to FIG. 4H, which shows the structure of the thin film transistor after performing the removing process. Here, the metal half tone mask may be etched. Please refer to FIG. 4L, which shows the structure of the thin film transistor after performing the etching process. Alternatively, the metal half tone mask may not be etched. Then, the method turns to the step S211.

In the step S211, a third photoresist 47 is coated on the first thin film transistor. Please refer to FIG. 4I, which shows the structure of the thin film transistor after performing the coating process. Then, the method turns to the step S212.

Figure 4I:
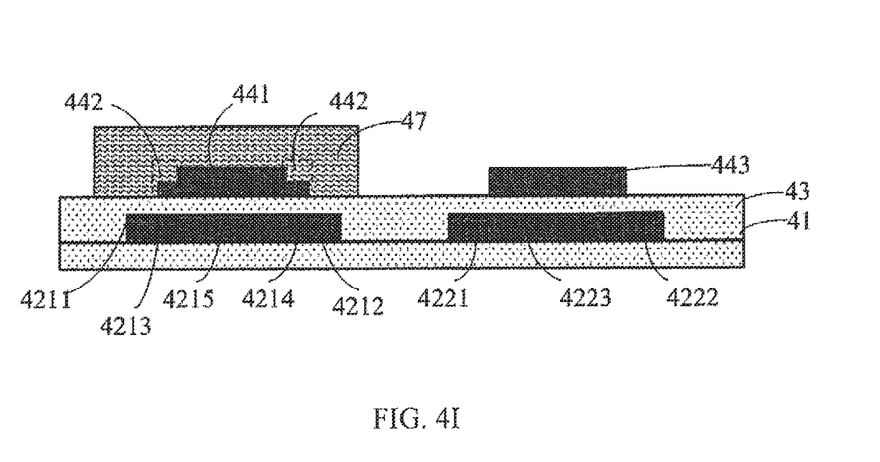

In the step S212, ions are implanted into the second active area 422. The second active area 422 without being shielded by the metal layer is implanted with ions, so as to form a source region 4221 and a drain region 4222 of the second thin film transistor. The second active layer 422 being shielded by the metal layer is not implanted with ions, and the active layer at this region forms a channel region 4223 of the second thin film transistor. Then, the method turns to the step S213.

Figure 4J:
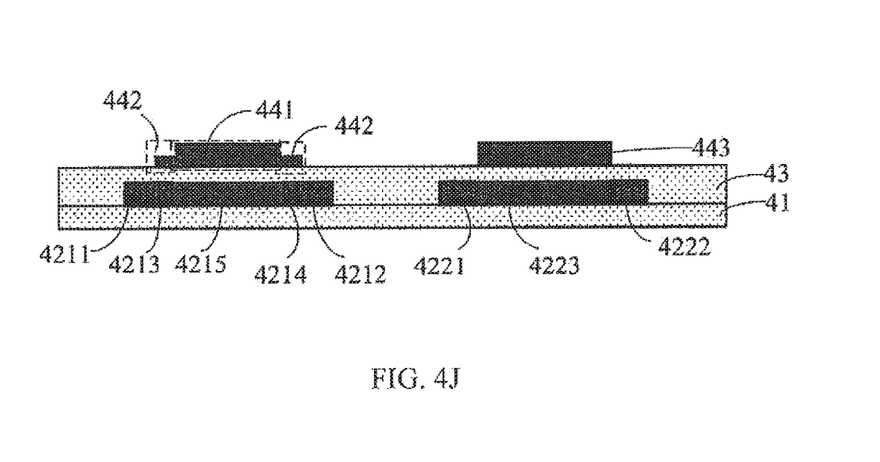

In the step S213, the third photoresist 47 is removed. Please refer to FIG. 4J, which shows the structure of the thin film transistor after performing the removing process. Then, the method turns to the step S214.

Figure 4K:
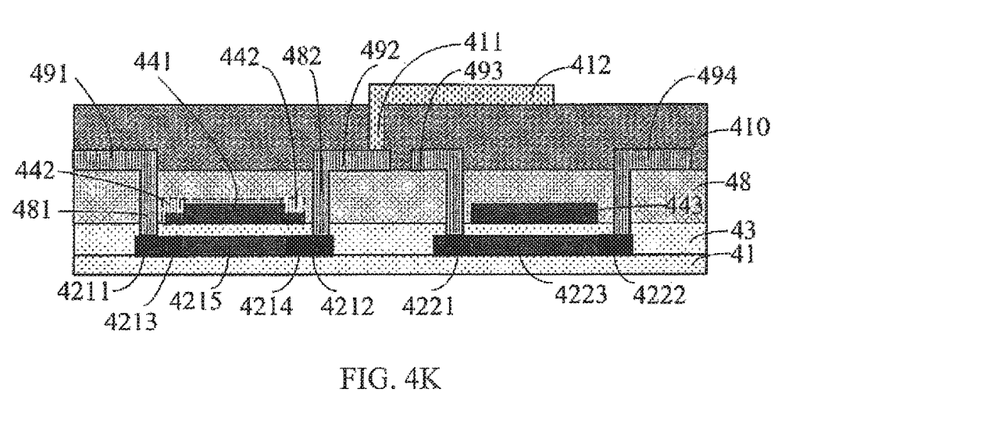
Figure 4L:
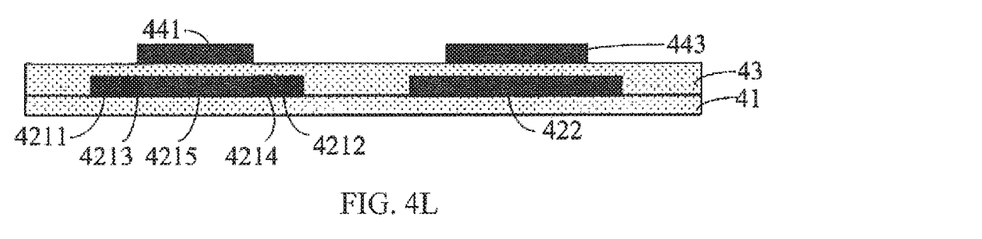

In the step S214, a media layer 48 is deposited over the substrate 41. A source through-hole 481 and a drain through-hole 482 are formed on the media layer 48 by performing photoresist coating, exposure, and etching processes. Then, the method turns to the step S215.

In the step S215, a second metal layer is deposited over the substrate 41, and the second metal layer is patterned, so as to form a source 491 and a drain 492 of the first thin film transistor through the source through-hole 481 and the drain through-hole 482. Then, the method turns to the step S216.

In the step S216, an organic planarization layer 410 is deposited over the substrate 41, and a pixel electrode through-hole 411 in formed on the organic planarization layer 410. Then, the method turns to the step S217.

Figure 4M:
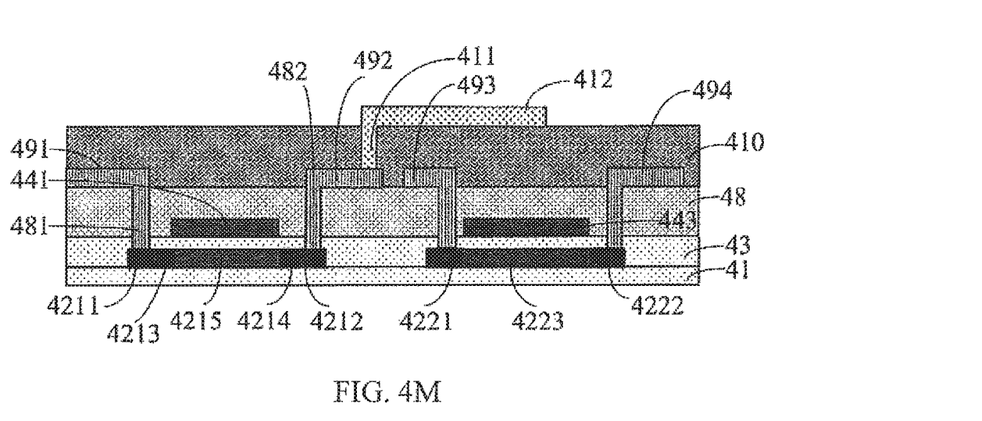

In the step S217, a pixel electrode layer is deposited over the substrate 41, and the pixel electrode layer is patterned, so as to form a corresponding pixel electrode 412 through the pixel electrode through-hole 411. Please refer to FIG. 4K, which shows the structure of the thin film transistor after manufacturing is completed. Please refer to FIG. 4M, which shows the structure of the thin film transistor if the metal half tone mask is etched in the step S210.

Thus, the thin film transistor of the present preferred embodiment is completed.

In comparison with the first preferred embodiment, the method of manufacturing a thin film transistor of the present preferred embodiment is implemented by optionally forming a lightly doped region on a plurality of thin film transistors for one substrate, thereby increasing the working stability of the thin film transistors and the corresponding liquid crystal display panel.

In the method of manufacturing a thin film transistor of the present invention, the lightly doped region is doped by using the metal half tone mask, so as to ensure that the lightly doped region formed on both sides of the source and the drain is symmetrical, and to keep the manufacturing process simple, so that the technical problem that a doping concentration is deviated or a gate region is shifted due to it being difficult to form a symmetrical lightly doped transition region on both sides of the source and the drain in the conventional method of manufacturing a thin film transistor.

In summary, the above descriptions are merely preferable embodiments of the present invention, but are not intended to limit the scope of the present invention. Any modification or replacement made by those skilled in the art without departing from the spirit and principle of the present invention should fall within the protection scope of the present invention. Therefore, the protection scope of the present invention is subject to the appended claims.

What is claimed is:

1. A method of manufacturing a thin film transistor, comprising:
   providing a substrate;
   depositing a buffer layer on the substrate and patterning the buffer layer, so as to form an active area of a thin film transistor;
   sequentially depositing an insulation layer and a first metal layer on the substrate;
   coating a photoresist on a gate region and a lightly doped region of the first metal layer, wherein the gate region and the lightly doped region are covered by a projection of the active area on the first metal layer;
   metal etching the first metal layer excluding the gate region and the lightly doped region for exposing the insulation layer;
   ashing the photoresist for exposing the lightly doped region of the first metal layer;
   metal etching the first metal layer at the lightly doped region for forming a metal half tone mask;
   implanting ions to the active area for forming a source region, a source lightly doped region, a channel region, a drain lightly doped region, and a drain region of the thin film transistor;
   removing the photoresist;
   depositing a media layer over the substrate, and forming a source through-hole and a drain through-hole on the media layer;
   depositing a second metal layer over the substrate, and patterning the second metal layer, so as to form a source and a drain of the thin film transistor through the source through-hole and the drain through-hole;

depositing an organic planarization layer over the substrate, and forming a pixel electrode through-hole on the organic planarization layer; and depositing a pixel electrode layer over the substrate, and patterning the pixel electrode layer, so as to form a corresponding pixel electrode through the pixel electrode through-hole;

wherein the step of depositing the buffer layer on the substrate and patterning the buffer layer, comprises:

depositing an amorphous silicon buffer layer on the substrate;

annealing the amorphous silicon buffer layer to form a polycrystalline silicon buffer layer; and patterning the polycrystalline silicon buffer layer.

2. The method of manufacturing a thin film transistor as claimed in claim 1, wherein after a step of removing the photoresist, the method further comprises: etching the metal half tone mask.

3. The method of manufacturing a thin film transistor as claimed in claim 1, wherein the first metal layer is a single metal layer or multiple metal layers and is selected from a group consisting of molybdenum and aluminum.

4. The method of manufacturing a thin film transistor as claimed in claim 1, wherein the thin film transistor is an N type metal-oxide-semiconductor thin film transistor, and the ions are phosphorus ions or arsenic ions.

5. The method of manufacturing a thin film transistor as claimed in claim 1, wherein the thin film transistor is a P type metal-oxide-semiconductor thin film transistor, and the ions are boron ions.

6. A method of manufacturing a thin film transistor, comprising:

providing a substrate;

depositing a buffer layer on the substrate and patterning the buffer layer, so as to form an active area of a thin film transistor;

sequentially depositing an insulation layer and a first metal layer on the substrate;

coating a photoresist on a gate region and a lightly doped region of the first metal layer, wherein the gate region and the lightly doped region are covered by a projection of the active area on the first metal layer;

metal etching the first metal layer excluding the gate region and the lightly doped region for exposing the insulation layer;

ashing the photoresist for exposing the lightly doped region of the first metal layer;

metal etching the first metal layer at the lightly doped region for forming a metal half tone mask;

implanting ions to the active area for forming a source region, a source lightly doped region, a channel region, a drain lightly doped region, and a drain region of the thin film transistor; and removing the photoresist.

7. The method of manufacturing a thin film transistor as claimed in claim 6, wherein after a step of removing the photoresist, the method further comprises: etching the metal half tone mask.

8. The method of manufacturing a thin film transistor as claimed in claim 6, wherein after a step of removing the photoresist, the method further comprises:

depositing a media layer over the substrate, and forming a source through-hole and a drain through-hole on the media layer;

depositing a second metal layer over the substrate, and patterning the second metal layer, so as to form a source and a drain of the thin film transistor through the source through-hole and the drain through-hole;

depositing an organic planarization layer over the substrate, and forming a pixel electrode through-hole on the organic planarization layer; and depositing a pixel electrode layer over the substrate, and patterning the pixel electrode layer, so as to form a corresponding pixel electrode through the pixel electrode through-hole.

9. The method of manufacturing a thin film transistor as claimed in claim 6, wherein a step of depositing the buffer layer on the substrate and patterning the buffer layer, comprises:

depositing an amorphous silicon buffer layer on the substrate;

annealing the amorphous silicon buffer layer to form a polycrystalline silicon buffer layer; and patterning the polycrystalline silicon buffer layer.

10. The method of manufacturing a thin film transistor as claimed in claim 6, wherein the first metal layer is a single metal layer or multiple metal layers and is selected from a group consisting of molybdenum and aluminum.

11. The method of manufacturing a thin film transistor as claimed in claim 6, wherein the thin film transistor is an N type metal-oxide-semiconductor thin film transistor, and the ions are phosphorus ions or arsenic ions.

12. The method of manufacturing a thin film transistor as claimed in claim 6, wherein the thin film transistor is a P type metal-oxide-semiconductor thin film transistor, and the ions are boron ions.

13. A method of manufacturing a thin film transistor, comprising:

providing a substrate;

depositing a buffer layer on the substrate and patterning the buffer layer, so as to form a first active area of a first thin film transistor and a second active area of a second thin film transistor;

sequentially depositing an insulation layer and a first metal layer on the substrate;

coating a first photoresist on a first gate region, a lightly doped region, and a second gate region of the first metal layer, wherein the first gate region and the lightly doped region are covered by a projection of the first active area on the first metal layer, and the second gate region is covered by a projection of the second active area on the first metal layer;

metal etching the first metal layer excluding the first gate region, the lightly doped region, and the second gate region for exposing the insulation layer;

coating a second photoresist on the second thin film transistor;

ashing the first photoresist for exposing the lightly doped region of the first metal layer;

metal etching the first metal layer at the lightly doped region for forming a metal half tone mask;

implanting ions to the first active area for forming a source region, a source lightly doped region, a channel region, a drain lightly doped region, and a drain region of the first thin film transistor; and removing the first photoresist and the second photoresist;

coating a third photoresist on the first thin film transistor;

implanting the ions to the second active area for forming a source region, a channel region, and a drain region of the second thin film transistor; and removing the third photoresist.

14. The method of manufacturing a thin film transistor as claimed in claim 13, wherein after a step of removing the first photoresist and the second photoresist, the method further comprises: etching the metal half tone mask.

15. The method of manufacturing a thin film transistor as claimed in claim 13, wherein after a step of removing the third photoresist, the method further comprises:
depositing a media layer over the substrate, and forming a source through-hole and a drain through-hole on the media layer;
depositing a second metal layer over the substrate, and patterning the second metal layer, so as to form a source and a drain of the first thin film transistor and a source and a drain of the second thin film transistor through the source through-hole and the drain through-hole;
depositing an organic planarization layer over the substrate, and forming a pixel electrode through-hole on the organic planarization layer; and
depositing a pixel electrode layer over the substrate, and patterning the pixel electrode layer, so as to form a corresponding pixel electrode through the pixel electrode through-hole.

16. The method of manufacturing a thin film transistor as claimed in claim 13, wherein a step of depositing the buffer layer on the substrate and patterning the buffer layer, comprises:
depositing an amorphous silicon buffer layer on the substrate;
annealing the amorphous silicon buffer layer to form a polycrystalline silicon buffer layer; and
patterning the polycrystalline silicon buffer layer.

17. The method of manufacturing a thin film transistor as claimed in claim 13, wherein the first metal layer is a single metal layer or multiple metal layers and is selected from a group consisting of molybdenum and aluminum.

18. The method of manufacturing a thin film transistor as claimed in claim 13, wherein the thin film transistor is an N type metal-oxide-semiconductor thin film transistor, and the implanted ions are phosphorus ions or arsenic ions.

19. The method of manufacturing a thin film transistor as claimed in claim 13, wherein the thin film transistor is a P type metal-oxide-semiconductor thin film transistor, and the implanted ions are boron ions.

* * * * *

UNITED STATES PATENT AND TRADEMARK OFFICE
CERTIFICATE OF CORRECTION

PATENT NO. : 10,340,365 B2
APPLICATION NO. : 15/121928
DATED : July 2, 2019
INVENTOR(S) : Macai Lu It is certified that error appears in the above-identified patent and that said Letters Patent is hereby corrected as shown below:

On the Title Page (73) Assignee Name:
Change "SHENZHEN CHINA STAR OPTOELECTRONICS TECHNOLOG CO. LTD,"
To --SHENZHEN CHINA STAR OPTOELECTRONICS TECHNOLOGY CO., LTD--

Signed and Sealed this
Twenty-second Day of October, 2019

Andrei Iancu
*Director of the United States Patent and Trademark Office*